United States Patent
Yin

(10) Patent No.: US 10,672,462 B2
(45) Date of Patent: Jun. 2, 2020

(54) DATA MANAGEMENT CIRCUIT

(71) Applicant: Wistron Corporation, New Taipei (TW)

(72) Inventor: Chia-Tsung Yin, New Taipei (TW)

(73) Assignee: Wistron Corporation, New Taipei (TW)

( * ) Notice: Subject to any disclaimer, the term of this patent is extended or adjusted under 35 U.S.C. 154(b) by 142 days.

(21) Appl. No.: 15/951,175

(22) Filed: Apr. 12, 2018

(65) Prior Publication Data

US 2019/0228819 A1     Jul. 25, 2019

(30) Foreign Application Priority Data

Jan. 23, 2018 (TW) .............................. 107102262 A

(51) Int. Cl.
| | |
|---|---|
| *G11C 11/419* | (2006.01) |
| *G11C 7/20* | (2006.01) |
| *H04W 4/70* | (2018.01) |
| *G06F 1/24* | (2006.01) |
| *G06F 9/30* | (2018.01) |
| *H04W 88/02* | (2009.01) |
| *G06F 3/06* | (2006.01) |

(52) U.S. Cl.
CPC .............. *G11C 11/419* (2013.01); *G06F 1/24* (2013.01); *G06F 9/30043* (2013.01); *G11C 7/20* (2013.01); *H04W 4/70* (2018.02); *H04W 88/025* (2013.01)

(58) Field of Classification Search
CPC ..... G11C 11/419; G06F 1/24; G06F 9/30043; H04W 4/70; H04W 88/025
See application file for complete search history.

(56) References Cited

U.S. PATENT DOCUMENTS

| | | | | |
|---|---|---|---|---|
| 6,253,319 | B1 * | 6/2001 | Tran .......................... | G06F 1/26 713/1 |
| 7,007,077 | B1 * | 2/2006 | Shinohara ................. | G06F 8/60 709/220 |
| 8,756,390 | B2 * | 6/2014 | Chu ......................... | G06F 21/80 711/100 |
| 8,788,850 | B1 * | 7/2014 | Kaul ...................... | G06F 21/755 713/300 |
| 2003/0236928 | A1 * | 12/2003 | Wang ........................ | G06F 1/24 710/8 |
| 2006/0248357 | A1 * | 11/2006 | Yang ......................... | G06F 1/32 713/300 |
| 2013/0238873 | A1 * | 9/2013 | Yu .......................... | G06F 3/0652 711/166 |
| 2014/0365743 | A1 * | 12/2014 | Pronozuk .............. | G06F 3/0623 711/166 |

* cited by examiner

*Primary Examiner* — Jaweed A Abbaszadeh
*Assistant Examiner* — Gayathri Sampath
(74) *Attorney, Agent, or Firm* — JCIPRNET

(57) ABSTRACT

A data management circuit is provided. The data management circuit includes a volatile memory, a power supply circuit, and a signal receiving circuit. An output terminal of the power supply circuit is coupled to the volatile memory, and an output terminal of the signal receiving circuit is coupled to the output terminal of the power supply circuit and the volatile memory. The power supply circuit is configured to provide power to the volatile memory. The signal receiving circuit is configured to receive a wireless control signal and to output a data clearance signal corresponding to the wireless control signal, such that data recorded in the volatile memory is cleared by the data clearance signal.

9 Claims, 3 Drawing Sheets

DATA MANAGEMENT CIRCUIT

CROSS-REFERENCE TO RELATED APPLICATION

This application claims the priority benefit of Taiwan application serial no. 107102262, filed on Jan. 23, 2018. The entirety of the above-mentioned patent application is hereby incorporated by reference herein and made a part of this specification.

BACKGROUND

Field of the Disclosure

The disclosure is related to a data management circuit.

Description of Related Art

The motherboard in most computer systems includes a complementary-metal-oxide-semiconductor random-access-memory (CMOS RAM) configured to record setting data of device such as configuration parameter, time and/or basic input/output system (BIOS) and so forth. In order to retain the data in the CMOS RAM when the power of computer system is off, generally existing motherboard is provided with a coin battery to provide the power required by the CMOS RAM when the power of computer system is off.

With such configuration, in the case when the user forgets password or the current setting of BIOS makes it impossible to activate the computer, no matter whether the coin battery is taken off or a button or a jumper is utilized to clear or reset the CMOS RAM, it is required to open the casing for operation. However, it takes time and a lot of work to open casing for operation, and it can easily cause damage to the casing or the motherboard.

SUMMARY

In view of the above, the disclosure provides a data management circuit which can reset volatile memory through a wireless control signal.

An embodiment of the disclosure provides a data management circuit, which includes a volatile memory, a power supply circuit and a signal receiving circuit. An output terminal of the power supply circuit is coupled to the volatile memory, and an output terminal of the signal receiving circuit is coupled to the output terminal of the power supply circuit and the volatile memory. The power supply circuit is configured to supply power to the volatile memory. The signal receiving circuit is configured to receive the wireless control signal and output a data clearance signal corresponding to the wireless control signal, such that the data recorded in the volatile memory is cleared by the data clearance signal.

An embodiment of the disclosure also provides a data management circuit configured to manage a volatile memory. The volatile memory is powered by a power supply circuit. The data management circuit includes a signal emitting circuit and a signal receiving circuit. An output terminal of the signal receiving circuit is coupled to an output terminal of the power supply circuit and the volatile memory. The signal emitting circuit is configured to generate and emit the wireless control signal, and the signal receiving circuit is configured to receive the wireless control signal and output a data clearance signal corresponding to the wireless control signal, such that the data recorded in the volatile memory is cleared by the data clearance signal.

In summary, the data management circuit provided in the embodiments of the disclosure uses the wireless control signal to transmit a ground signal to a power port of the volatile memory such that the power supply circuit that originally supplies power to the volatile memory cannot supply power to the volatile memory. In this manner, it is possible to save the trouble opening the casing, and thus avoiding causing damage to the casing or the motherboard, and the volatile memory can be reset or the data in the volatile memory can be cleared in a more convenient manner.

In order to make the aforementioned features and advantages of the disclosure more comprehensible, embodiments accompanying figures are described in detail below.

DESCRIPTION OF EMBODIMENTS

Figure 1:
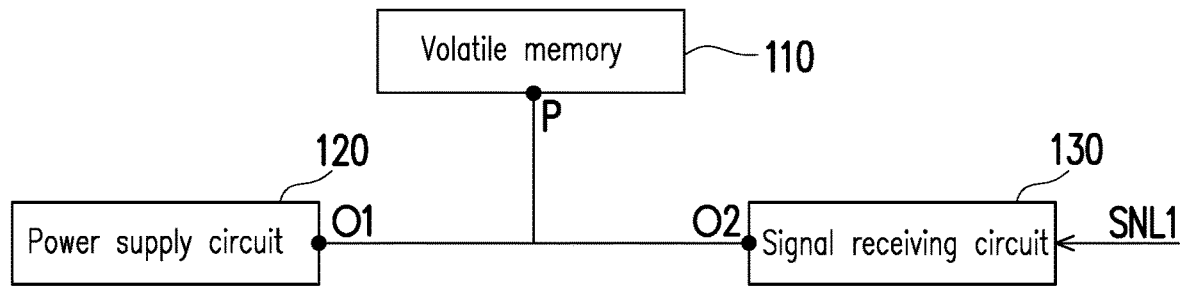
FIG. 1 is a schematic block diagram illustrating a data management circuit according to an embodiment of the disclosure.

FIG. 1 is a schematic block diagram illustrating a data management circuit according to an embodiment of the disclosure.

Referring to FIG. 1, a data management circuit 100 includes a volatile memory 110, a power supply circuit 120 and a signal receiving circuit 130, wherein an output terminal O1 of the power supply circuit 120 is coupled to a power port P of the volatile memory 110 to supply power to the volatile memory 110, and an output terminal O2 of the signal receiving circuit 130 is coupled to the output terminal O1 of the power supply circuit 120 and the power port P of the volatile memory 110. In particular, through such connection approach, the output terminal O2 of the signal receiving circuit 130 and the power port P of the volatile memory 110 are equipotential to each other.

In some embodiments, the volatile memory 110, the power supply circuit 120 and the signal receiving circuit 130 are, for example, but not limited to being disposed in the casing. After the signal receiving circuit 130 receives a wireless control signal SNL1 from the outside of the casing, the data clearance signal corresponding to the wireless control signal SNL1 is output from the output terminal O2, and the data clearance signal resets the volatile memory 110 or clear the data recorded in the volatile memory 110. Specifically, based on the characteristic of the volatile memory 110, the data recorded in the volatile memory 110 disappears or reset after power is off. Therefore, in some embodiments, the data clearance signal includes, for example, a ground signal, which transmits the signal outputting the ground potential GND to the power port P of the volatile memory 110 during a specific time period.

In some embodiments, the volatile memory 110 is a static random-access-memory (SRAM). For instance, the volatile memory 110 is, for example, a complementary-metal-oxide-semiconductor random-access-memory (CMOS RAM) configured on the motherboard to record the setting data of basic input/output system (BIOS) and can be, for example, connected to a southbridge chip or integrated in a southbridge chipset, which should not be construed as a limitation to the disclosure.

In other embodiments, the volatile memory 110 may be realized as one of the static random-access-memory or other types of volatile memory or a combination thereof, which should not be construed as a limitation to the disclosure.

In some embodiments, the power supply circuit 120 at least includes a battery such that power can be continuously supplied to the volatile memory 110 when the data management circuit 100 cannot obtain power externally.

Figure 2:
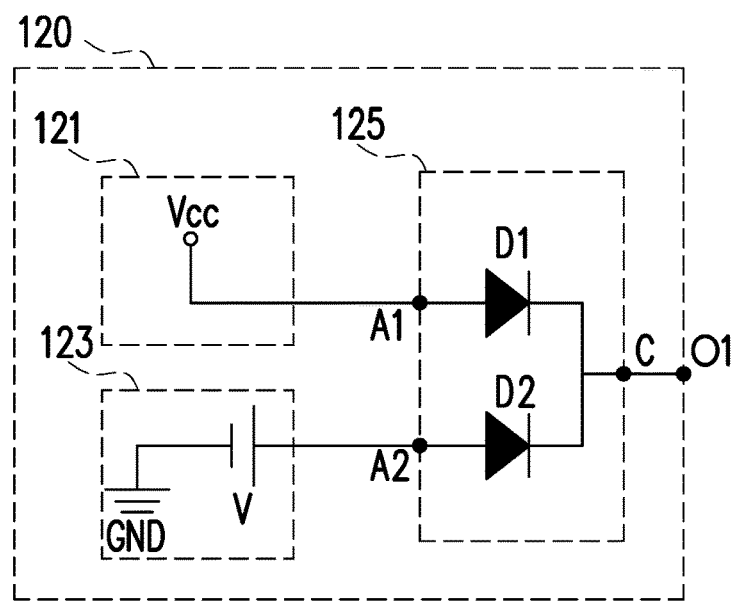
FIG. 2 is a schematic circuit diagram illustrating a power supply circuit according to an embodiment of the disclosure.

FIG. 2 is a schematic circuit diagram illustrating a power supply circuit according to an embodiment of the disclosure.

Referring to FIG. 2, in some embodiments, in addition to a battery 123, the power supply circuit 120 further includes a system power 121 and a diode circuit 125, and the power required by the volatile memory 110 is supplied by at least one of the system power 121 and the battery 123. For example, when the volatile memory 110 is disposed on the motherboard of the computer system, a system potential Vcc (e.g., 3.33 volts) provided by the system power 121 may be, for example, the power from the motherboard, and the battery 123 is, for example, a coin battery disposed on the motherboard to provide a potential V (e.g., 3 volts). When the computer system is activated, the power may be supplied to the volatile memory 110 by the system power 121 or by the system power 121 and the battery 123 together. However, when the computer system is shut down, the system power 121 is also turned off (e.g., the provided potential is reduced to ground potential GND), and thus the battery 123 can supply power to the volatile memory 110 when the system power 121 is turned off.

Specifically, the diode circuit 125 includes, for example, a first diode D1 and a second diode D2. A first anode A1 of the first diode D1 is coupled to the system power 121, a second anode A2 of the second diode D2 is coupled to the positive electrode of the battery 123, and cathodes C of the first diode D1 and the second diode D2 are mutually coupled to the output terminal O1 of the power supply circuit 120. In some embodiments, the negative electrode of the battery 123 is grounded, which should not be construed as a limitation to the disclosure.

Figure 3:
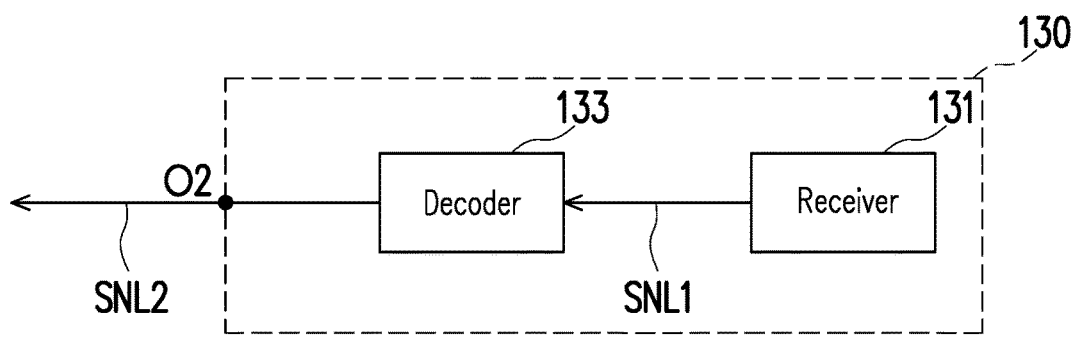
FIG. 3 is a schematic block diagram illustrating a signal receiving circuit according to an embodiment of the disclosure.

FIG. 3 is a schematic block diagram illustrating a signal receiving circuit according to an embodiment of the disclosure.

Referring to FIG. 3, the signal receiving circuit 130 includes a receiver 131 and a decoder 133, wherein an output terminal of the receiver 131 is coupled to an input terminal of the decoder 133, and an output terminal of the decoder 133 is coupled to the output terminal O2 of the signal receiving circuit 130.

In some embodiments, the receiver 131 receives the wireless control signal SNL1 from the signal emitting circuit (not shown in FIG. 3), and the decoder 133 performs a decoding operation on the wireless control signal SNL1 to generate a data clearance signal SNL2, and the data clearance signal SNL2 is output through the output terminal O2. For example, the receiver 131 is configured to receive the wireless control signal SNL1 in an infrared band. Therefore, a user can use a signal emitting circuit (e.g., infrared controller) of the infrared band to perform encoding operation on the data clearance signal SNL2 that includes the ground signal to generate and emit the wireless control signal SNL1 in an analog format. After the receiver 131 receives the analog wireless control signal SNL1, the wireless control signal SNL1 is converted into digital format and decoded by the decoder 133. The decoder 133, for example, performs a decoding operation corresponding to the encoding operation of the signal emitting circuit on the digital wireless control signal SNL1 to generate the data clearance signal SNL2 including the ground signal, and the data clearance signal SNL2 is output from the output terminal O2.

It should be mentioned that the disclosure provides no limitation to the frequency band or format of the wireless control signal SNL1. In other embodiments, the wireless controls signal SNL1 may be realized as a Bluetooth signal, a near-field communication (NFC) signal or a digital or an analog signal of any frequency band.

In particular, with the encoding/decoding operation described above, it can be ensured that the received wireless control signal SNL1 is the signal that is transmitted for the purpose of resetting the volatile memory 110, such that erroneous operation of the data management circuit 100 can be avoided effectively.

Referring to FIG. 1 again, according to the preceding paragraphs, after the signal emitting circuit 130 receives the wireless control signal SNL1, the data clearance signal SNL2 corresponding to the wireless control signal SNL1 is output from the output terminal O2, and in the specific time period of the ground signal included in the data clearance signal SNL2 received by the volatile memory 110, the potential of the power port P of the volatile memory 110 is the ground potential GND, and thus the power supply circuit 120 cannot supply power to the volatile memory 110. In this manner, the data in the volatile memory 110 is cleared or reset.

Additionally, in some embodiments, to further avoid erroneous operation that causes the data in the volatile memory 110 to be cleared or reset against the user's intention, the data management circuit 100 further includes a switch control circuit to control the open/closed status between the output terminal O2 of the signal receiving circuit 130 and the output terminal O1 of the power supply circuit 120 as well as the power port P of the volatile memory 110.

Figure 4:
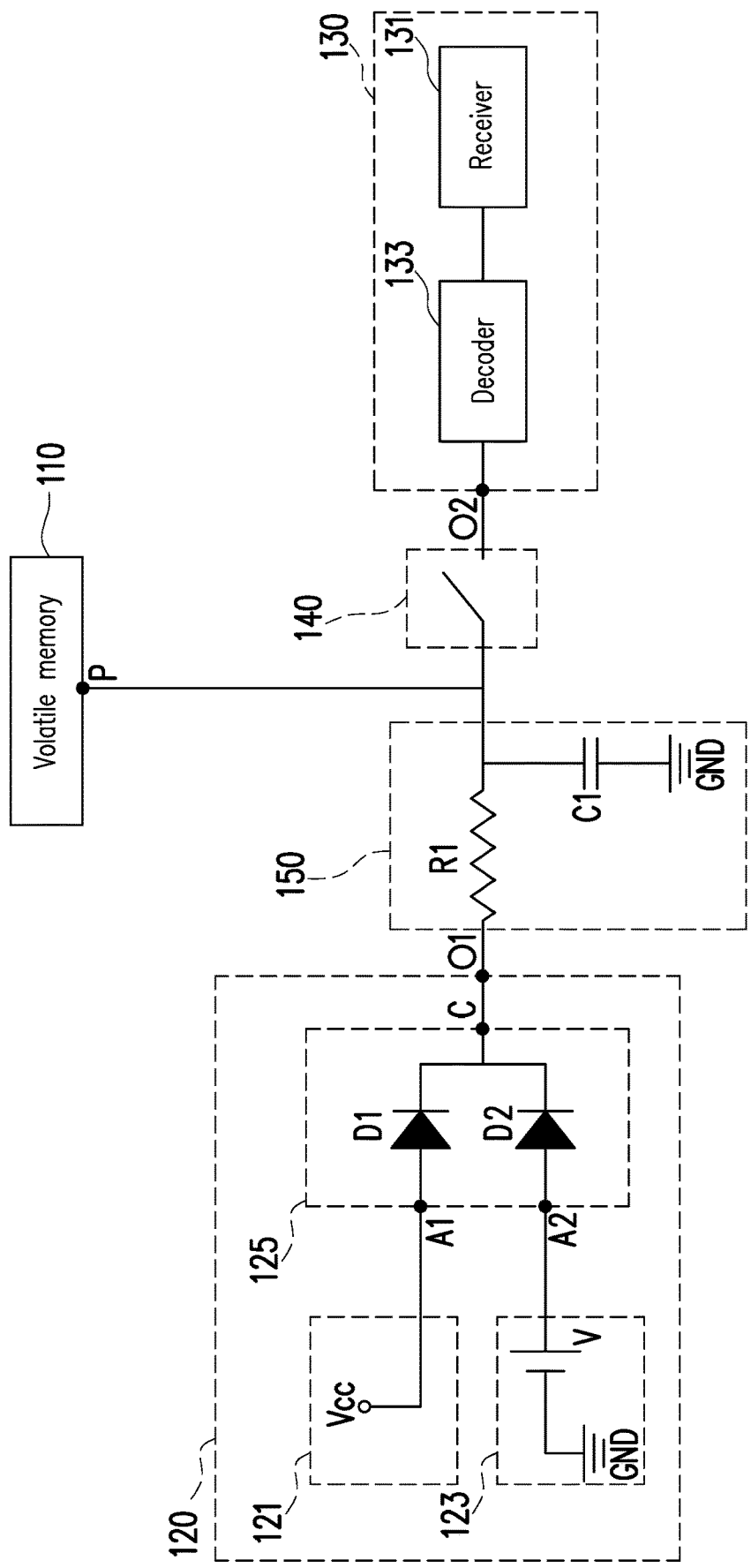
FIG. 4 is a schematic circuit diagram illustrating a data management circuit according to an embodiment of the disclosure.

FIG. 4 is a schematic circuit diagram illustrating a data management circuit according to an embodiment of the disclosure.

Referring to FIG. 4, in some embodiments, the data management circuit 100 not only has the volatile memory 110, the power supply circuit 120 and the signal receiving circuit 130 described in the preceding paragraphs, but also includes a switch control circuit 140 and a filtering circuit 150.

As shown in FIG. 4, the switch control circuit 140 is coupled between the signal receiving circuit 130 and the volatile memory 110, and also coupled between the signal receiving circuit 130 and the power supply circuit 120. When the switch control circuit 140 is turned on (closed), there is a closed-circuit between the output terminal O2 of the signal receiving circuit 130 and the power port P of the volatile memory 110, and the data clearance signal SNL2 can be transmitted to the power port P; that is, the output terminal O2 and the power port P may be regarded as being equipotential to each other. On the contrary, when the switch control circuit 140 is not turned on (open), there is an open-circuit between the output terminal O2 of the signal receiving circuit 130 and the power port P of the volatile memory 110, and the data clearance signal SNL2 cannot be transmitted to the power port P. In some embodiments, the switch control circuit is realized as one of a slide switch, a jumper or other manual switch or a combination thereof, which should not be construed as a limitation to the disclosure.

On the other hand, the filtering circuit 150 is coupled between the power supply circuit 120 and the volatile memory 110, and also coupled between the power supply circuit 120 and the signal receiving circuits 130. In some embodiments, the filtering circuit 150 consists of a resistor R1 and a capacitor C1, wherein a first end of the resistor R1 is coupled to the output terminal O1 of the power supply circuit 120, and a second end of the resistor R1 is coupled to the first end of the capacitor C1, and a second end of the capacitor C1 is grounded. In this manner, the filtering circuit 150 can, for example, provide a protection mechanism to avoid that the element at the rear end of the power supply circuit 120 being damaged due to occasional excessive current. Persons of ordinary skill in the art should have basic understanding and knowledge of the filtering circuit 150 and thus no repetition is incorporated herein.

Referring to FIG. 4, when the user of the data management circuit 100 is to reset the volatile memory 110 through the wireless control signal SNL1, the user can, for example, manually turn on the switch control circuit 140 to conduct the output terminal O2 of the signal receiving circuit 130 and the power port P of the volatile memory 110. In this manner, the data clearance signal SNL2 generated by the signal receiving circuit 130 enables the potential of the power port P of the volatile memory 110 to be equal to the ground potential GND at least in a specific time period of the ground signal of the data clearance signal SNL2, such that the power supply circuit 120 cannot supply power to the volatile memory 110. In this manner, the data in the volatile memory 110 is cleared or reset.

On the contrary, when the user of the data management circuit 100 does not wish to reset the volatile memory 110 through the wireless control signal SNL1, the user can, for example, let the switch control circuit 140 to stay in an open-status such that the output terminal O2 of the signal receiving circuit 130 and the power port P of the volatile memory 110 is not conducted. In this manner, the volatile memory 110 can receive the power supplied by at least one of the system power 121 and the battery 123.

Figure 5:
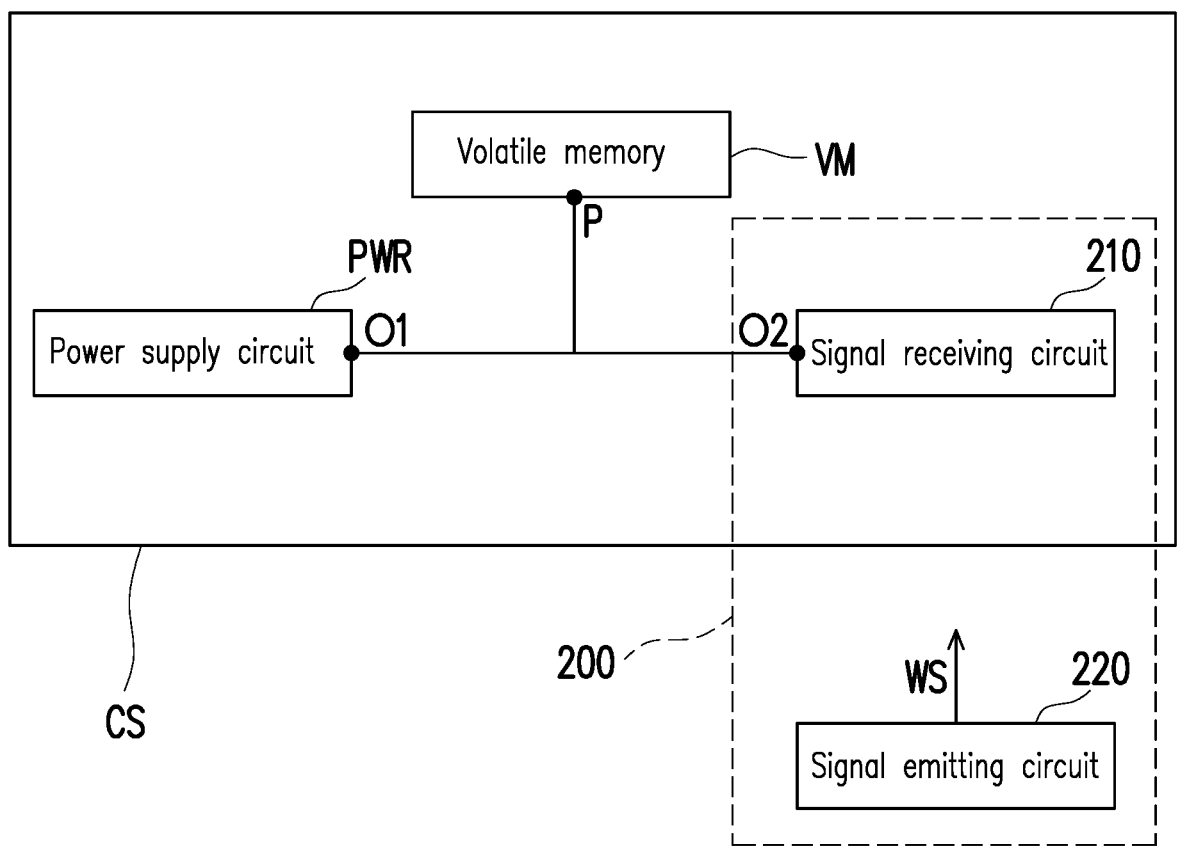
FIG. 5 is a schematic block diagram illustrating a data management circuit according to an embodiment of the disclosure.

FIG. 5 is a schematic block diagram illustrating a data management circuit according to an embodiment of the disclosure.

Referring to FIG. 5, a data management circuit 200 is configured to manage a volatile memory VM, and the volatile memory VM may be powered by a power supply circuit PWR. Specifically, the data management circuit 200 includes a signal receiving circuit 210 and a signal emitting circuit 220. An output terminal O1 of the power supply circuit PWR is coupled to a power port P of the volatile memory VM to supply power to the volatile memory VM, and an output terminal O2 of the signal receiving circuit 210 is coupled to the output terminal O1 of the power supply circuit PWR and the power port P of the volatile memory VM.

In the embodiment of FIG. 5, the volatile memory VM, the power supply circuit PWR, the signal receiving circuit 210 and the signal emitting circuit 220 are respectively similar to the volatile memory 110, the power supply circuit 120, the signal receiving circuit 130 and the signal emitting circuit introduced in the preceding paragraphs, and thus no repetition is incorporated herein.

In some embodiments, the signal receiving circuit 210 and the signal emitting circuit 220 of the data management circuit 200 are respectively disposed inside and outside a casing CS. Specifically, the volatile memory VM, the power supply circuit PWR and the signal receiving circuit 210 are all disposed inside the casing CS, and the signal emitting circuit 220 is disposed outside the casing CS. In this manner, the user can, for example, generate and emit a wireless control signal WS through the signal emitting circuit 220 outside the casing CS. In one embodiment, the signal emitting circuit 220 generates the wireless control signal WS through an approach similar to the approach of generating the wireless control signal SNL1 described in the preceding paragraphs, that is, the signal emitting circuit 220 performs the encoding operation to generate the wireless control signal WS and emit the generated wireless control signal WS. After the signal receiving circuit 210 receives the wireless control signal WS, for example, the decoding operation corresponding to the encoding operation of the signal emitting circuit 220 is performed on the wireless control signal WS to generate the data clearance signal, and such data clearance signal resets the volatile memory VM or clear the data recorded in the volatile memory VM.

In this manner, by using the data management circuit 200, the user can utilize the signal emitting circuit 220 outside the casing CS to emit the wireless control signal WS to the signal receiving circuit 210 inside the casing CS, thereby resetting the volatile memory VM or clear the data in the volatile memory VM through the signal receiving circuit 210. Such clearing method does not require the casing to be opened, thereby avoiding causing damage to the casing or the motherboard.

It should be indicated that the disclosure provides no limitation to the frequency band or format of the wireless control signal WS. For example, the wireless control signal WS may be an infrared wireless control signal WS, a Bluetooth wireless control signal WS, a near-field communication wireless control signal or a wireless control signal of any frequency band or protocol.

Based on the above, the data management circuit provided in the embodiment of the disclosure uses the wireless control signal to transmit the ground signal to the power port of the volatile memory, such that the power supply circuit that is configured to supply power to the volatile memory cannot supply power to the volatile memory. In this manner, it is possible to save the trouble opening the casing and thus avoiding causing damage to the casing or the motherboard, such that the volatile memory can be reset or the data in the volatile memory can be cleared in a more convenient manner.

Although the disclosure has been disclosed by the above embodiments, the embodiments are not intended to limit the disclosure. It will be apparent to those skilled in the art that various modifications and variations can be made to the structure of the disclosure without departing from the scope or spirit of the disclosure. Therefore, the protecting range of the disclosure falls in the appended claims.

What is claimed is:

1. A data management circuit, comprising:
   a volatile memory;
   a power supply circuit, wherein an output terminal of the power supply circuit is coupled to the volatile memory, and the power supply circuit is configured to supply power to the volatile memory;

a signal receiving circuit, wherein an output terminal of the signal receiving circuit is coupled to the output terminal of the power supply circuit and the volatile memory; and a switch control circuit, wherein an input terminal of the switch control circuit is coupled to the output terminal of the signal receiving circuit, and an output terminal of the switch control circuit is coupled to the output terminal of the power supply circuit and the volatile memory, wherein the signal receiving circuit is configured to receive a wireless control signal and output a data clearance signal including a ground signal based on the wireless control signal such that a data recorded in the volatile memory is cleared by the data clearance signal, wherein when the switch control circuit is manually turned on and the wireless control signal is received by the signal receiving circuit, the signal receiving circuit outputs the data clearance signal to the switch control circuit so as to transmit the data clearance signal directly from the switch control circuit to the volatile memory, wherein when the volatile memory is operated in a data clearance mode based on the data clearance signal including the ground signal, the volatile memory does not receive the power from the power supply circuit due to a ground potential of the volatile memory set by the data clearance signal.

2. The data management circuit according to claim 1, wherein the volatile memory is a complementary-metal-oxide-semiconductor random-access-memory and coupled to a southbridge chip.

3. The data management circuit according to claim 2, wherein the volatile memory is configured to record setting data of a basic input/output system.

4. The data management circuit according to claim 1, wherein the power supply circuit comprises a battery and a system power, wherein at least one of the battery and the system power is configured to supply power to the volatile memory.

5. The data management circuit according to claim 4, wherein the power supply circuit further comprises:

a diode circuit, comprising a first anode, a second anode and a cathode, wherein the first anode is coupled to the system power, the second anode is coupled to a positive electrode of the battery, and the cathode is coupled to the volatile memory.

6. The data management circuit according to claim 1, wherein the signal receiving circuit comprises:

a receiver, configured to receive the wireless control signal; and a decoder, configured to perform a decoding operation on the wireless control signal to output the data clearance signal.

7. The data management circuit according to claim 1, wherein the switch control circuit is configured to control an open/closed status between the output terminal of the signal receiving circuit and the volatile memory, and control an open/closed status between the output terminal of the power supply circuit and the volatile memory.

8. The data management circuit according to claim 1, wherein the volatile memory, the power supply circuit and the signal receiving circuit are disposed inside a casing.

9. A data management circuit, configured to manage a volatile memory, wherein the volatile memory is powered by a power supply circuit, the data management circuit comprising:

a signal emitting circuit, configured to generate and emit a wireless control signal;

a signal receiving circuit, wherein an output terminal of the signal receiving circuit is coupled to an output terminal of the power supply circuit and the volatile memory; and a switch control circuit, wherein an input terminal of the switch control circuit is coupled to the output terminal of the signal receiving circuit, and an output terminal of the switch control circuit is coupled to the output terminal of the power supply circuit and the volatile memory, wherein the signal receiving circuit is configured to receive the wireless control signal and output a data clearance signal including a ground signal based on the wireless control signal such that a data recorded in the volatile memory is cleared by the data clearance signal, wherein when the switch control circuit is manually turned on and the wireless control signal is received by the signal receiving circuit, the signal receiving circuit outputs the data clearance signal to the switch control circuit so as to transmit the data clearance signal directly from the switch control circuit to the volatile memory, wherein when the volatile memory is operated in a data clearance mode based on the data clearance signal including the ground signal, the volatile memory does not receive the power from the power supply circuit due to a ground potential of the volatile memory set by the data clearance signal.

* * * * *